United States Patent [19]

Shafir

[11] Patent Number: 5,701,099

[45] Date of Patent: Dec. 23, 1997

[54] TRANSCONDUCTOR-C FILTER ELEMENT WITH COARSE AND FINE ADJUSTMENT

[75] Inventor: Haim Shafir, Sacramento, Calif.

[73] Assignee: Level One Communications, Inc., Sacramento, Calif.

[21] Appl. No.: 562,690

[22] Filed: Nov. 27, 1995

[51] Int. Cl.$^6$ .............................. H03K 5/00; G06F 15/31
[52] U.S. Cl. ...................... 327/552; 327/103; 327/553; 327/560; 327/563; 330/304; 330/107; 330/258; 364/724.01
[58] Field of Search ........................ 327/551, 552, 327/553, 555, 556, 557, 558, 559, 560, 103, 563; 330/305, 304, 107, 109, 258, 294; 364/724.2, 724.01; 331/57

[56] References Cited

U.S. PATENT DOCUMENTS

| | | |
|---|---|---|
| 3,528,040 | 9/1970 | Galvin . |
| 3,579,122 | 5/1971 | Paine et al. . |
| 3,798,576 | 3/1974 | Torpie et al. . |
| 4,071,827 | 1/1978 | Koike et al. . |
| 4,129,748 | 12/1978 | Saylor . |
| 4,283,788 | 8/1981 | Tamburelli . |
| 4,306,203 | 12/1981 | Sasaki et al. . |
| 4,571,731 | 2/1986 | Klinkovsky et al. . |
| 4,751,663 | 6/1988 | Yamazaki . |
| 4,815,103 | 3/1989 | Cupo et al. . |
| 4,862,485 | 8/1989 | Guinea et al. . |
| 4,887,278 | 12/1989 | Gupta . |
| 4,908,787 | 3/1990 | Dyer . |
| 5,028,888 | 7/1991 | Ray . |
| 5,029,167 | 7/1991 | Arnon et al. . |
| 5,153,875 | 10/1992 | Takatori . |
| 5,157,690 | 10/1992 | Buttle . |
| 5,214,671 | 5/1993 | Nakai . |
| 5,257,286 | 10/1993 | Ray . |
| 5,297,165 | 3/1994 | Ueda et al. . |
| 5,325,317 | 6/1994 | Peterson et al. ............... 364/724.01 |
| 5,353,312 | 10/1994 | Cupo et al. . |

FOREIGN PATENT DOCUMENTS 2013387  8/1992  WIPO .................. 327/552

OTHER PUBLICATIONS

Veirman et al. ("Design of a Bipolar 10 MHZ Programmable Continous–Time 0.05° Equiripple Linear Phase Filter"), IEEE Journal of Solid State Circuits, vol. 27, No. 3, Mar. 1992, pp. 324–331.
Computer Search Listing.

*Primary Examiner*—Timothy P. Callahan
*Assistant Examiner*—Dinh T. Le
*Attorney, Agent, or Firm*—Merchant, Gould, Smith, Edell, Welter & Schmidt

[57] ABSTRACT

A transconductor-C filter that has coarse and fine control mechanisms allowing for both high speed and high current filtering of the same signal. The filter uses a current controlled oscillator and filter elements that have switchable amplification devices enabling the circuit to adapt to external and internal conditions in real-time. An equalizer is described utilizing the transconductor-C element. Finally, a Phase Locked Loop for providing the control signals to the transconductor-C element is also described.

21 Claims, 5 Drawing Sheets

TRANSCONDUCTOR-C FILTER ELEMENT WITH COARSE AND FINE ADJUSTMENT

BACKGROUND OF THE INVENTION

1. Field of the Invention

This invention relates in general to a transconductor-C (capacitor) element used in continuous high frequency filtering, and more specifically, to a transconductor-C element having coarse and fine control circuitry.

2. Description of Related Art

A transconductor-C circuit, also known in the art as a gm-C circuit, is widely used in the industry to filter high frequency signals on a continuous basis. These transconductor-C circuits are typically used to provide filtering through all types of environments that vary as functions of time, temperature, process variation, and voltage supply differences. Typically, these circuits only have one control voltage or current to allow control over changes in temperature, circuit degradation, and power supply variations. This requires the filter designer to use filter elements, usually transistors, that will work well over the entire range of input frequencies and external conditions.

The use of a single control source to vary the response of the filter element also presents a problem for the filter designer, since the filter can only be controlled in a coarse sense. Fine adjustments to the filter response cannot be corrected by the single control which must control the circuit over a large array of possible conditions. The designer is forced to give up accuracy of control in order to enable the circuit to work over all of the external conditions that the circuit will be exposed to.

It can be seen then that there is a need for a transconductor-C circuit which allows for a more precise control of the circuit.

It can also be seen that there is a need for a transconductor-C circuit that can adequately function without degrading the circuit's capabilities at the extremes of external conditions and process variations.

Further, there is a need for a transconductor-C circuit for performing filtering functions with precision in high speed applications over a wide range of temperature, process and power supply variations.

SUMMARY OF THE INVENTION

To overcome the limitations in the prior art described above, and to overcome other limitations that will become apparent upon reading and understanding the present specification, the present invention discloses a powerful and cost effective method of providing high speed, filtering, and high dynamic range in a wide range of environments.

The present invention solves the above-described problems by providing two branches of input filters. The branches can be switched on and off as required to enable the circuit to most adequately amplify or filter the signal being applied to the transconductor-C element. The present invention also uses a fine control transistor working as a current source to give more precise control of the output of the filter.

A system in accordance with the principles of the present invention comprises a current controlled oscillator, where several of the transconductor-C elements are combined to provide a self-limiting oscillator which can withstand a larger range of environments than circuits in the prior art.

In one embodiment, an equalizer is provided using several transconductor-C elements according to the invention, which are combined to provide a fixed-pole, adjustable zero filtering circuit.

One object of the present invention is the ability of the circuit to be controlled in both a coarse and fine manner to allow precise control of the circuit under all conditions.

Another object of the present invention is the ability of the circuit to turn on each branch separately or turn on both branches of the filter, which allows one circuit to amplify or filter the signal under all process, voltage, and temperature conditions.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides the ability to control a larger range of signals, with greater precision, over a larger environmental range, than circuits in the prior art.

Figure 1:
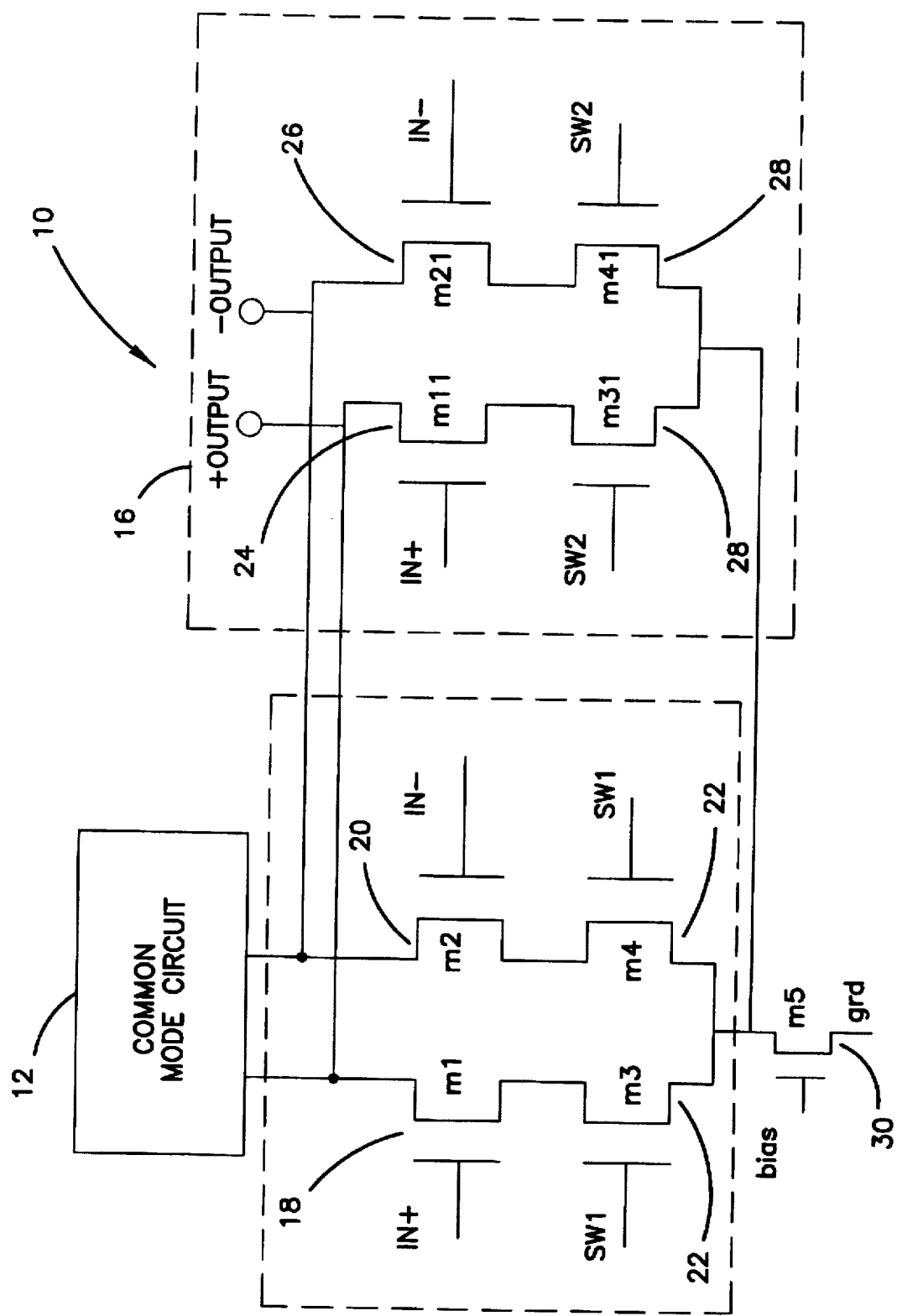
FIG. 1 is a circuit diagram of the transconductor-C element.

FIG. 1 illustrates a transconductor-C element 10 according to the present invention. The common mode circuit 12 provides a regulated common mode output voltage of transconductor-C element 10. The first branch 14 and second branch 16 portions of the transconductor-C element 10 are schematically identical, but the input transistors differ in their internal design characteristics.

In the present invention, the gm-C elements use metal-oxide-semiconductor field-effect transistors (MOSFETs). However, those skilled in the art will recognize that bipolar or other types of transistors may be used without departing from the teaching of the invention. Further, those skilled in the art will recognize that the functions of the devices can be performed using discrete, hybrid, or single-chip circuits, and that the transconductor-C element 10 can have more than two branches to accommodate further refinements of control and environmental adaptation.

In the first branch 14, positive input transistor 18 and negative input transistor 20 are designed to withstand high levels of current flowing through them. If the transistors 18 and 20 are MOSFETs, the transistor channel width may be large or the channel length may be small to allow for larger channel currents. Those skilled in the art will recognize that other types of devices, such as bipolar transistors, discrete components, or a combination of different types of devices could be designed to accommodate large amounts of current in accordance with the present invention.

The coarse control transistors 22 are used to enable current flow through the positive input transistor 18 and the negative input transistor 20. When the channel is opened in the coarse control transistors 22, current is allowed to flow in the positive input transistor 18 and the negative input transistor 20.

In the second branch 16, positive input transistor 24 and negative input transistor 26 are designed for lower current carrying capacity. If the transistors 24 and 26 are MOSFETs, the transistor channel width may be small or the channel length may be long to operate well in low current levels. Those skilled in the art will recognize that other types of devices, such as bipolar transistors, discrete components, or a combination of different types of devices could be designed to accommodate large amounts of current in accordance with the present invention.

The coarse control transistors 28 are used to enable current flow through the positive input transistor 24 and the negative input transistor 26. When the channel is opened in the coarse control transistors 28, current is allowed to flow through the positive input transistor 18 and the negative input transistor 20.

The fine control transistor 30 is used to control the current in the first branch 14 and the second branch 16. The current flow in the first branch 14 and the second branch 16 is regulated by varying the current flow in the fine control transistor 30 which is connected in series with the branches 14 and 16 of the transconductor-C element 10.

The fine control transistor 30 can be a single transistor as shown in FIG. 1, but those skilled in the art will recognize that more than one transistor can provide more precise control of the current flow in the first branch 14 and the second branch 16. Those skilled in the art will also recognize that other types of devices, such as bipolar transistors, discrete components, or a combination of different types of devices could be designed to perform the function of the fine control transistor 30 in accordance with the present invention.

During operation of the transconductor-C element 10, the transconductor-C element 10 is connected to an input signal that has a positive and negative potential. The negative potential can be a ground potential, which would make the transconductor-C element 10 a single-ended filter. The positive input signal is connected to the control ports of the positive input transistor 18 and the high input transistor 24, and the negative input signal is connected to the control port of the negative input transistor 20 and the low input transistor 26.

Control circuitry is connected to the control ports of the coarse control transistors 22, the coarse control transistors 28, and the fine control transistor 30. Signals connected to the control ports of the coarse control transistors 22 and the coarse control transistors 28 will enable the proper branch of the transconductor-C element 10 to be active. The signal connected to the control port of the fine control transistor 30 will adjust the current flow in the branch of the transconductor-C element 10 that was enabled by the other control signals that are connected to the coarse control transistors 22 and the coarse control signals 28.

If the conditions under which the circuit operates, such as varying supply voltage, process variations, or temperature changes require a high current carrying capability, the first branch 14 will be selected by the control circuitry. To accomplish that, a voltage is applied to the control port of the coarse control transistors 22 which will open the channels of the coarse control transistors 22, and current will flow through the coarse control transistors 22, the positive input transistor 18, and the negative input transistor 20. In addition, a voltage signal is applied to the control port of the coarse control transistors 28 which will prevent current from flowing in the channels of the coarse control transistors 28, the positive input transistor 24 and the negative input transistor 26.

For fine control of the transconductor-C element 10, a time varying voltage signal is applied to the control port of the fine control transistor 30. This time varying voltage signal will change the amount of channel current in the fine control transistor 30, and since it is connected in series with the coarse control transistors 22, the positive input transistor 18, and the negative input transistor 20, the current in the coarse control transistors 22, the positive input transistor 18, and the negative input transistor 20 can be varied.

If the conditions under which the circuit operates, such as varying supply voltage, process variations, or temperature changes require a low current carrying capability, the second branch 16 will be selected by the control circuitry. To accomplish that, a voltage is applied to the control port of the coarse control transistors 28 which will open the channels of the coarse control transistors 28, and current will flow through the coarse control transistors 28, the positive input transistor 24, and the negative input transistor 26. In addition, a voltage signal is applied to the control port of the coarse control transistors 22 which will prevent current from flowing in the channels of the coarse control transistors 22, the positive input transistor 18 and the negative input transistor 20. Again, the fine control of the transconductor-C element 10 is accomplished by applying a time varying voltage signal to the control port of the fine control transistor 30. Because of the series connection, this time varying signal will control the current flow in the coarse control transistors 28, the positive input transistor 24, and the negative input transistor 26.

For conditions that require even more current carrying capability than the first branch 14 can handle alone, both the first branch 14 and the second branch 16 are used. This is accomplished by sending signals to the control ports to open the channels of the coarse control transistors 22 and the channels of the coarse control transistors 28, allowing current flow in both branches of the transconductor-C element 10.

The fine control transistor 30 is still used as an incremental control on the current flow in the branches by connecting a time varying voltage signal to the control port of the fine control transistor 30.

Those skilled in the art will recognize that more than two branches to provide even finer control over a time varying voltage input signal without deviating from the teaching of the present invention.

Figure 2:
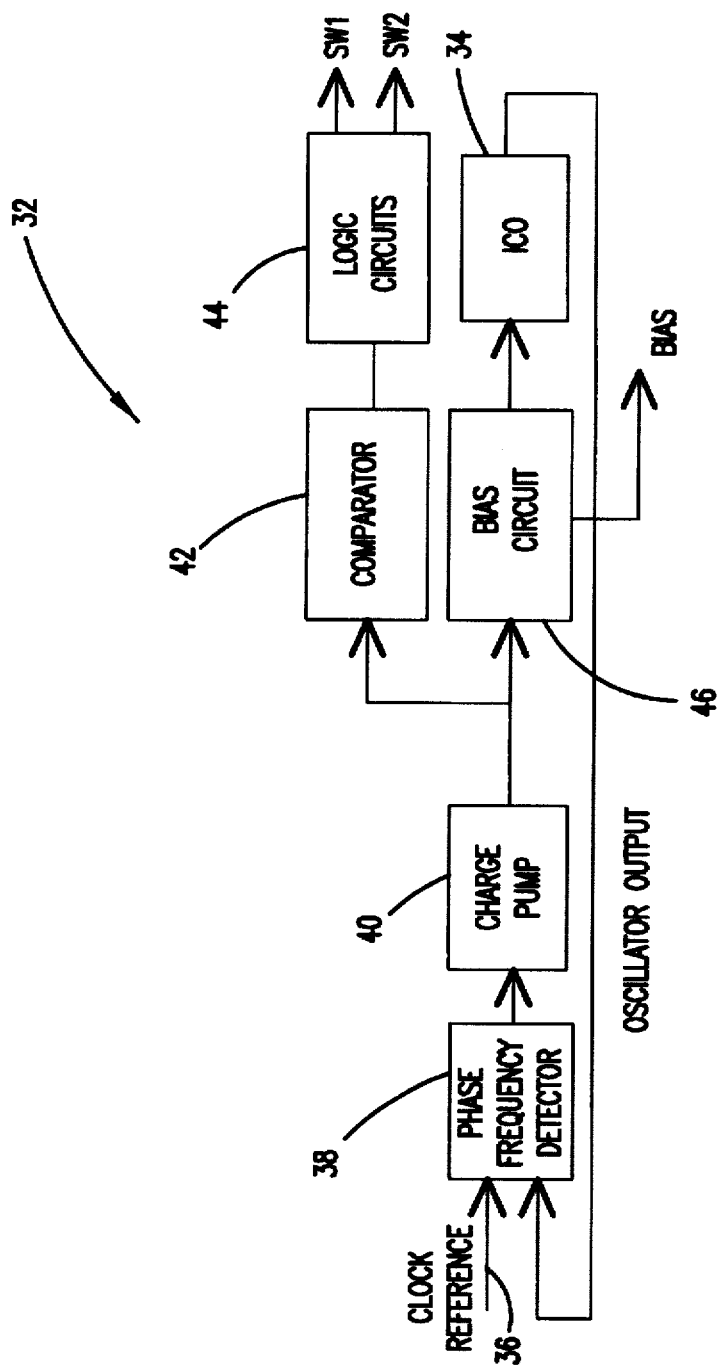
FIG. 2 is a block diagram of the phase locked loop system that provides the control voltages for the transconductor-C element.

FIG. 2 is a block diagram of the phase locked loop system 32 that provides the control voltages for the transconductor-C element 10. The control voltages are generated by a PLL (phase lock loop) made of transconductor-C elements 10 and other circuits.

The output of a current controlled oscillator 34 and an external clock reference 36 are connected to the inputs of a phase detector 38. The phase detector 38 generates a voltage which is proportional to the difference in phase between the output of the current controlled oscillator 34 and the clock reference 36.

The output voltage of the frequency detector 38 is connected to the input of a charge pump 40, which generates an output control voltage. The output control voltage of the charge pump 40 is connected to the input of a comparator 42 which has two trip points.

The comparator 42 is set such that when the phase lock loop system 32 is powered on, the comparator sends a signal to the logic circuit 44 such that the output of the logic circuit 44 connected to the coarse control transistors 22 is high or on, and the output of the logic circuit 44 connected to the coarse control transistors 28 is low or off.

If the control voltage from the charge pump 40 crosses an upper bound the comparator 42 sends a signal to the logic circuit 44 to set the state of the output of the logic circuit 44 connected to the coarse control transistors 22 to off and set the state of the output of the logic circuit 44 connected to the coarse control transistors 28 to on.

If the control voltage from the charge pump 40 crosses a lower bound, the comparator 42 sends a signal to the logic circuit 44 to set the state of the output connected to the coarse control transistors 22 to off and set the state of the output of the logic circuit 44 connected to the coarse control transistors 28 to on.

The output from the charge pump 40 is also supplied to a bias circuit 46 which translates the control voltage into a current. This current output is connected to the input of the current controlled oscillator 34 as a control signal for the current controlled oscillator 34.

The bias circuit 46 also uses the control voltage output from the charge pump 40 to generate the control signal for the fine control transistor 30.

The output of the current controlled oscillator 34 is then used as an input to the phase detector 38 as a feedback signal to complete the loop. As the clock reference 36 changes in phase, the phase lock loop system 32 will change the outputs from the logic circuit 44 and the bias circuit 46 to control the transconductor-C element 10.

Figure 3:
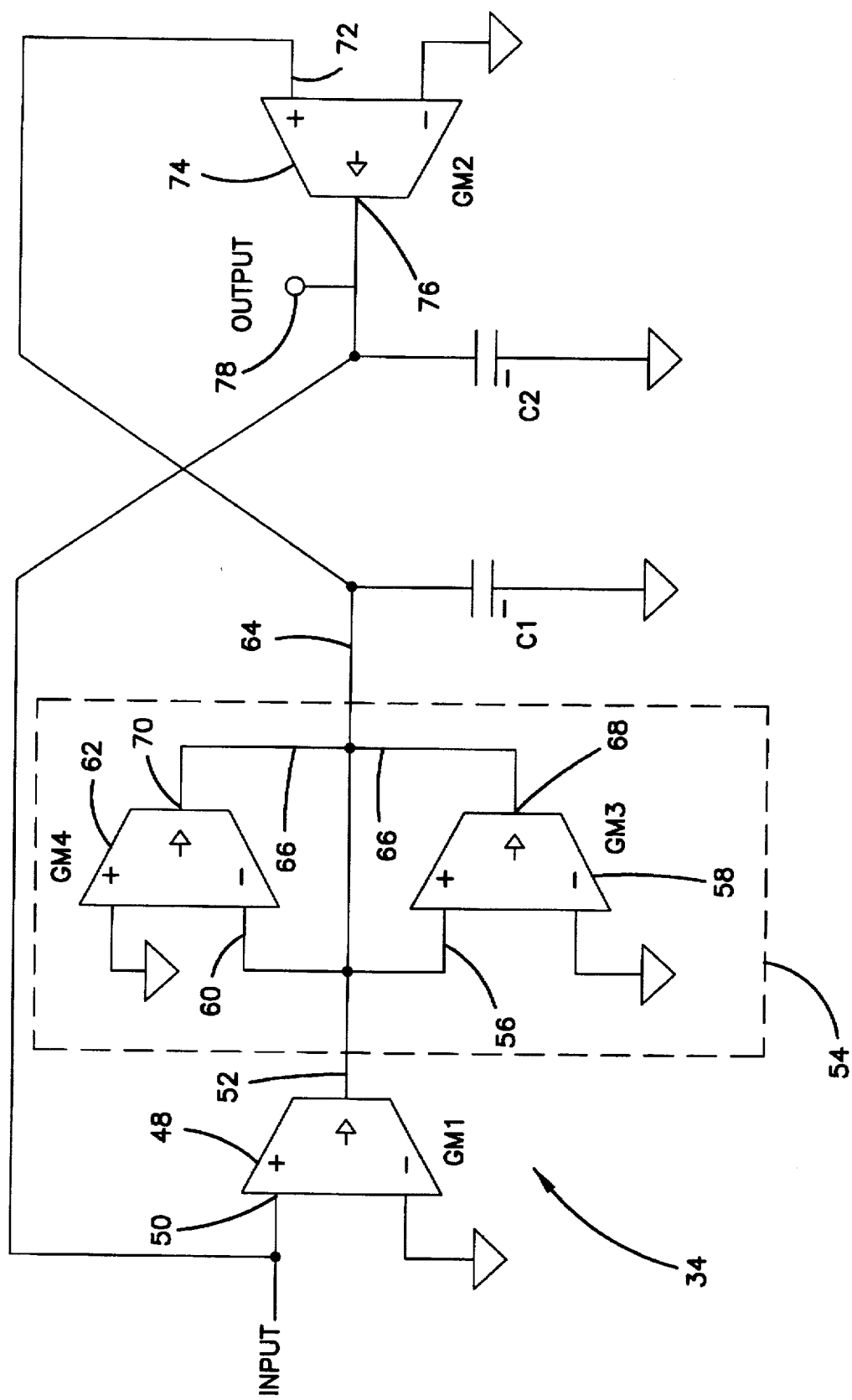
FIG. 3 is a schematic diagram of the current controlled oscillator of FIG. 2.

FIG. 3 is a schematic diagram of the current controlled oscillator 34 of FIG. 2. Each of the filters shown on FIG. 3 is a transconductor-C element 10. The bias, sw1, and sw2 signals that are generated by the phase lock loop system 32 are used as control signals for the current controlled oscillator 34, just as the bias, sw1, and sw2 signals are used as control signals for the transconductor-C element 10.

Transconductor-C element gm1 48 acts as the first stage of the oscillator. It is a non-inverting amplifier since the input to the current controlled oscillator 34 is connected to the positive input 50 of the transconductor-C element gm1 48.

The output 52 of transconductor-C element gm1 48 is connected to limiting stage 54. The limiting stage 54 input is connected to the positive input 56 of element gm3 58 and the negative input 60 of element gm4 62, as well as the output 64 of the limiting stage 54. Elements gm3 58 and gm4 62 act as a limiting stage to limit the voltage swing of the output of the first stage of the oscillator. The limiting function is performed by the feedback lines 66, which connect the output 68 of element gm3 58 and the output 70 of element gm4 62 to the output 52 of transconductor-C element 48.

The output 64 of limiting stage 54 is then connected to the positive input 72 of feedback element gm2 74. The output 76 of feedback element gm2 74 is connected to the input 50 of transconductor-C element gm1 48. The oscillator output 78 is the desired signal output from the current controlled oscillator 34.

The current controlled oscillator 34 operates on a dual feedback basis which creates the oscillations. For a given input, there is a feedback loop between the output of transconductor-C element gm1 48 and the feedback element gm3 58. This feedback loop has an internal feedback loop tied to opposing inputs by feedback lines 66. When these two loops operate in conjunction, the phase of one will always be trying to cancel out the voltage swing of the other, and vice versa, creating an oscillatory output 78.

Figure 4A:
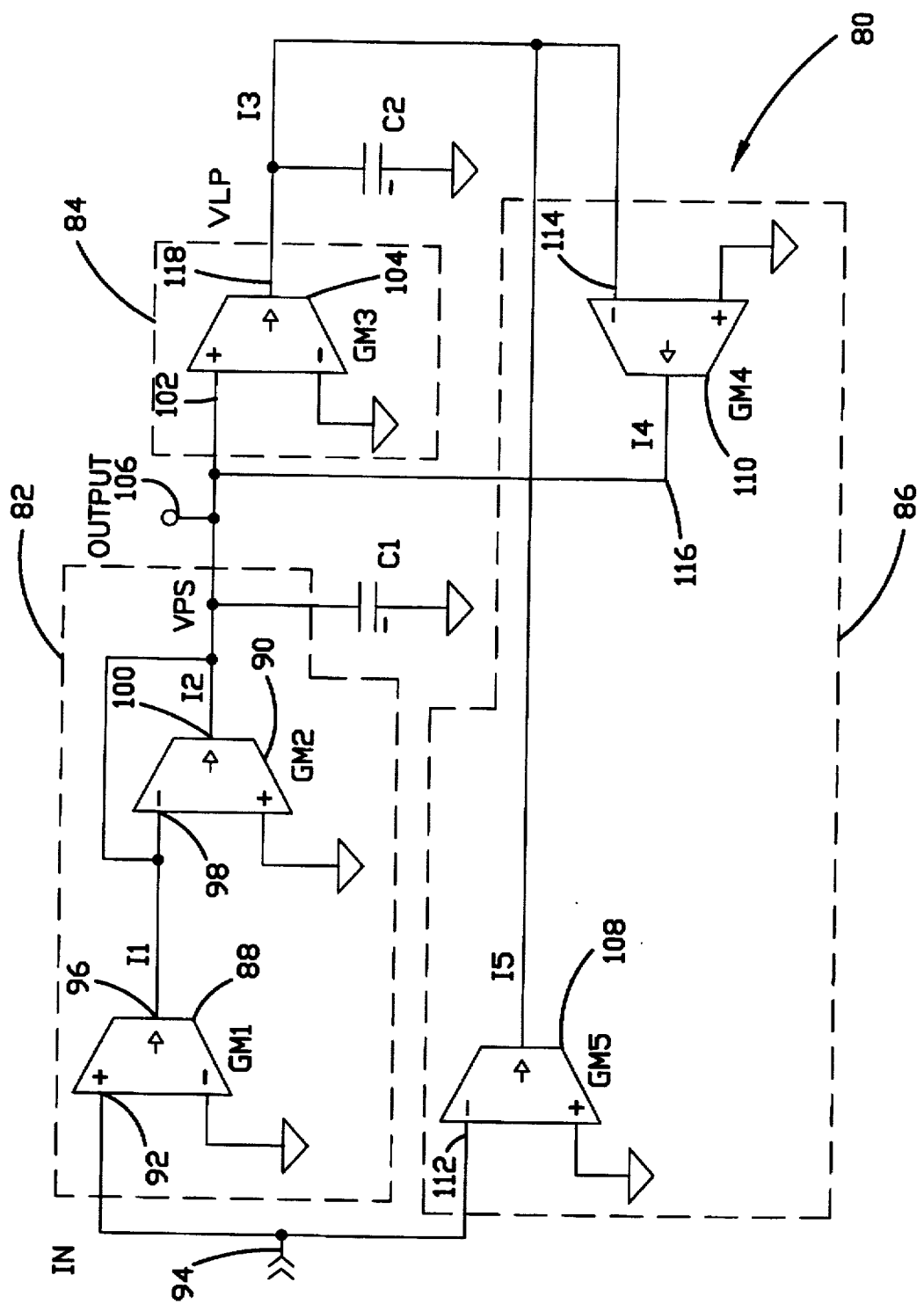
FIG. 4A is a schematic diagram of a single-ended equalizer with fixed-poles and an adjustable zero using transconductor-C elements according to the invention.

FIG. 4A is a schematic diagram of a single-ended equalizer with fixed-poles and an adjustable zero using transconductor-C elements according to the invention. The equalizer 80 is comprised of a first stage 82, a feedback stage 84, and a parallel stage 86.

The first stage 82 contains element gm1 88 and element gm2 90. The positive input 92 of element gm1 88 is connected to the equalizer input 94. The output 96 of element gm1 88 is connected to the negative input 98 of element gm2 90. The output 100 of element gm2 90 is connected back to the negative input 98 of element gm2 90 to provide feedback for the first stage 82. The output 100 of element gm2 90 is also connected to the positive input 102 of element gm3 104, which is in the feedback stage 84. The output of element gm2 90 is also the equalizer output 106.

The parallel stage 86 contains element gm5 108 and element gm4 110. The equalizer input 94 is connected to the negative input 112 of element gm5 108. The output of element gm5 108 is connected to the negative input 114 of element gm4 110. The output 116 of element gm4 110 is connected to the output 100 of element gm2 90, which is the equalizer output 106.

The feedback stage 84 is comprised of element gm3 104. The feedback stage 84 provides a feedback loop between the equalizer output 106 and the input 114 to element gm4 110. The positive input 102 of element gm3 104 is connected to the output 100 of element gm2 90, and the output 118 of element gm3 104 is connected to the negative input 114 of element gm4 110.

The poles, zeros and Vbp transfer function for the equalizer 80 and the equalizer 120 are determined as follows.

The current output by transconductor-C element gm1 88 is proportional to the input voltage. Similarly, the current output of element gm2 90 is proportional to the input voltage to element gm2 90, and since the inverting input 98 of element gm2 90 is being used, the output current will be inverted with respect to the voltage. The current output of element gm3 104 will be proportional to the input voltage Vbp to element gm3 104. The output current of element gm4 110 is proportional to the input voltage to element gm4 110, and since the inverting input 114 of element gm4 110 is being used, the output current will be inverted with respect to the voltage. Finally, the output current of element gm5 108 is proportional to the input voltage to element gm5 108, and since the inverting input 112 of element gm5 108 is being used, the output current will be inverted with respect to the voltage, as follows:

I1=gm1Vin
I2=−gm2Vbs
I3=gm3Vbp
I4=−gm4Vlp
I5=−gm5Vin

The sum of the output currents from element gm1 88, gm2 90, and gm4 110 equals the complex capacitance of C1 times the voltage at the positive plate of capacitor C1. Similarly, the sum of the output currents from element gm5 108 and gm3 104 equals the complex capacitance of C2 times the voltage at the positive plate of capacitor C2:

I1+I2+I4=sC1Vpb
I3+I5=sC2Vlp

Substituting for the current terms yields:

gm1Vin−gm2Vbp−gm4Vlp=sC1Vbp
gm3Vbp−gm5Vin=sC2Vlp

Solving for the output 118 of element gm3 104 yields:

$$Vlp = \frac{gm3Vbp - gm5Vin}{sC2}$$

Substituting for the output 118 of element gm3 104 yields:

$$gm1Vin - gm2Vbp - \frac{gm4gm3Vbp}{sC2} + \frac{gm4gm5Vin}{sC2} = sC1Vbp$$

Rearranging terms:

$$gm1Vin + \frac{gm4gm5}{sC2} Vin = sC1Vbp + gm2Vbp + \frac{gm4gm3}{sC2} Vbp$$

Accordingly, the transfer function is given by:

$$\frac{Vbp}{Vin} = \frac{gm1 + \frac{gm4gm5}{sC2}}{sC1 + gm2 + \frac{gm4gm3}{sC2}} = \frac{s\frac{gm1}{C1} + \frac{gm4gm5}{C1C2}}{s^2 + \frac{gm2}{C1} + \frac{gm4gm3}{C1C2}}$$

Further, it follows that the overall direct current gain is given by:

$$DCgain = \frac{\frac{gm4gm5}{C1C2}}{\frac{gm4gm3}{C1C2}} = \frac{gm5}{gm3}$$

and the zeroes are given by:

$$s\frac{gm1}{C1} = -\frac{gm4gm5}{C1C2}$$

$$Zero = -\frac{gm4gm5}{gm1C2}$$

Finally, Wo and Q are given by:

$$Wo = \sqrt{\frac{gm3gm4}{C1C2}}$$

$$Q = \frac{C1}{gm2} \sqrt{\frac{gm3gm4}{C1C2}}$$

The poles, zeros and Vlp transfer function for the equalizer 80 and the equalizer 120 are determined as follows.

The current in each leg of the circuit is proportional to the gain of each element times the input voltage to that element:

I1=gm1Vin
I2=−gin2Vbs
I3=gin3Vbp
I4=−gm4Vlp
I5=−gm5Vin

The sum of the output currents from element gm1 88, gm2 90, and gm4 110 equals the complex capacitance of C1 times the voltage at the positive plate of capacitor C1. Similarly, the sum of the output currents from element gm5 108 and gm3 104 equals the complex capacitance of C2 times the voltage at the positive plate of capacitor C2:

I1+I2+I4=sC1Vpb
I3+I5=SC2Vlp

Substitution for the current terms yields:

gm1Vin−gm2Vbp−gm4Vlp=sC1Vbp
gm3Vbp−gm5Vin=sC2Vlp

Solving for $V_{bp}$ yields:

$$Vbp = \frac{sC2}{gm3} Vlp + \frac{gm5}{gm3} Vin$$

Substitution for $V_{bp}$ yields:

$$gm1Vin - \frac{gm2sC2}{gm3} Vlp - \frac{gm2gm5}{gm3} Vin - gm4Vlp =$$

$$\frac{s^2C1C2}{gm3} Vlp + \frac{sC1gm5}{gm3} Vin$$

Rearranging terms and removing common elements yields:

$$Vin \left( gm1 - \frac{gm2gm5}{gm3} - \frac{sC1gm5}{gm3} \right) =$$

$$Vlp \left( \frac{s^2C1C2}{gm3} + \frac{sgm2C2}{gm3} + gm4 \right)$$

Thus, the transfer function is given by:

$$\frac{Vlp}{Vin} = \frac{gm1gm3 - gm2gm5 - sC1gm5}{s^2C1C2 + sgm2C2 + gm4gm3}$$

which may be rewritten as follows:

$$\frac{Vlp}{Vin} = \frac{\frac{gm1gm3 - gm2gm5}{C1C2} - s\frac{gm5}{C2}}{s^2 + s\frac{gm2}{C1} + \frac{gm4gm3}{C1C2}}$$

The overall direct current gain and zero are given by:

$$DCgain = \frac{gm1gm3 - gm2gm5}{gm4gm3}$$

$$Zero = \frac{gm1gm3 - gm2gm5}{C1gm5}$$

It can be seen that the zero for the equalizer 80 may be adjusted by changing the gain of element gm1 88 while the other gain parameters of equalizer 80 remain the same.

Figure 4B:
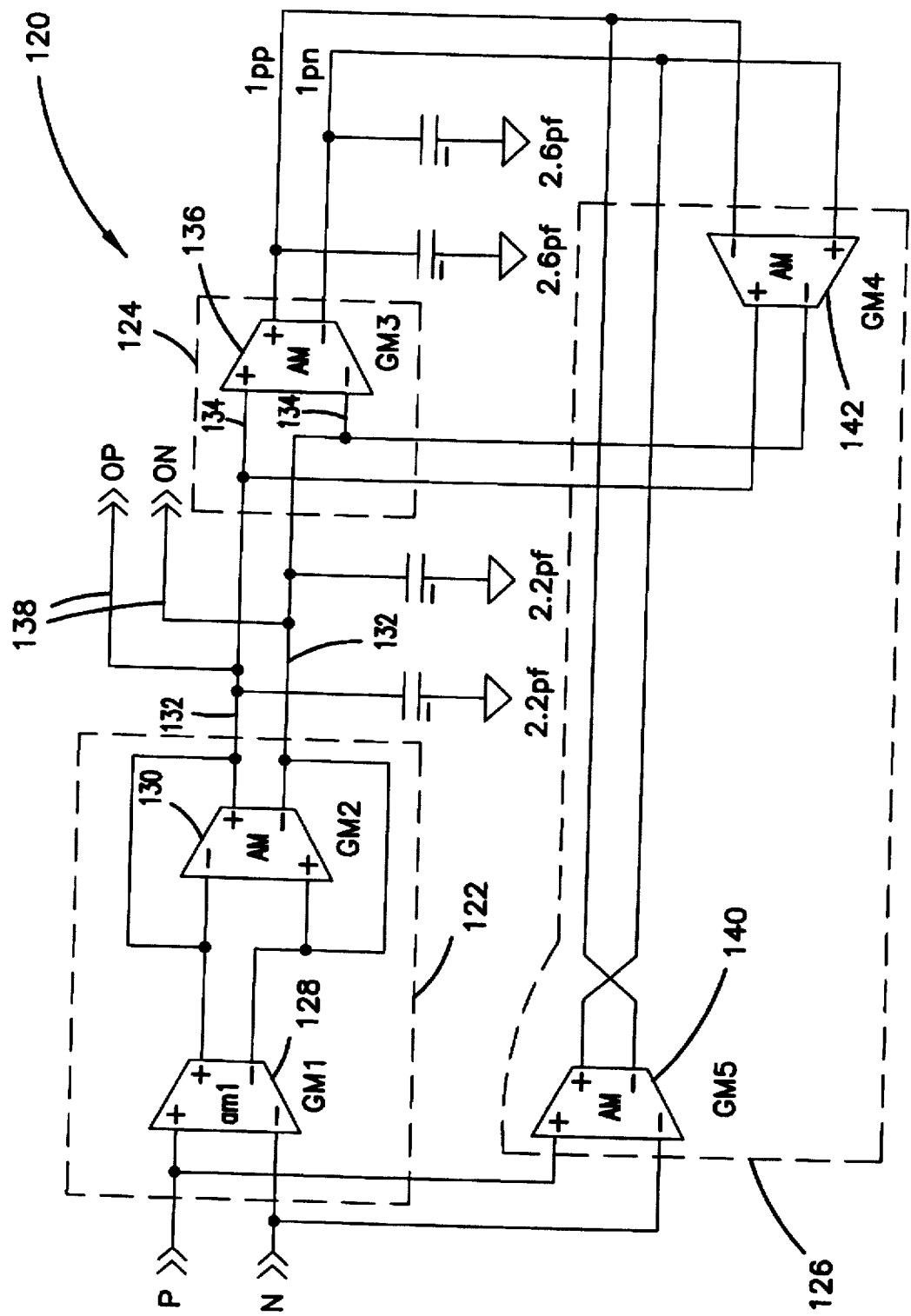
FIG. 4B is a schematic diagram of a differential equalizer with fixed-poles and an adjustable zero using transconductor-C elements according to the invention.

FIG. 4B is a schematic diagram of a differential equalizer with fixed-poles and an adjustable zero using transconductor-C elements according to the invention. The differential equalizer is a second embodiment that uses the transconductor-C elements to allow the equalizer to withstand various environmental characteristics. FIG. 4B is a differential embodiment of the single ended equalizer 80 of FIG. 4A.

Differential equalizer 120 is comprised of a first stage 122, a feedback stage 124, and a parallel stage 126.

The first stage 122 contains element gm1 128 and element gm2 130 connected in a differential mode. The output 132 of element gm2 130 is connected in a differential mode to the positive input 134 of element gm3 136, which is in the feedback stage 124. The differential output 132 of element gm2 130 is also the differential equalizer output 138.

The parallel stage 126 contains element gm5 140 and element gm4 142.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A transconductor-C element, comprising:

a common mode voltage controller for providing a controlled common mode voltage;

a first amplifier, coupled to the common mode voltage controller, for amplifying an input signal with large dynamic range into a higher voltage output signal using the controlled common mode voltage;

a second amplifier, coupled to the common mode voltage controller for amplifying said input signal of rapidly changing frequency into the higher voltage output signal using the controlled common mode voltage; and a coarse control circuit, coupled to the first amplifier and the second amplifier, for selectively commencing operations of the second amplifier and the first amplifier, wherein the first amplifier is selected to dampen the input signal when the input signal has high current swings in order to produce the higher voltage output having current swings of a smaller amplitude, the second amplifier is selected to dampen the input signal when the input signal has high frequency oscillations in order to produce the higher voltage output signal having oscillations of a lower frequency, and both the first amplifier and the second amplifier are selected simultaneously to dampen the input signal when the input signal has both high current swings and high frequency oscillations in order to produce the higher voltage output signal having smaller amplitude current swings and lower frequency oscillations.

2. The transconductor-C element of claim 1, further comprising a fine control circuit, coupled to the coarse control circuit, for varying a gain in the first amplifier and the second amplifier by adjusting a current flow through the first amplifier and the second amplifier selected by the coarse control circuit.

3. The transconductor-C element of claim 2, wherein the coarse control circuit is comprised of at least one transistor, a control port of the transistor being coupled to a control signal, a first port of the transistor being coupled to the first amplifier and the second amplifier, and a second port being coupled to the fine control circuit.

4. The transconductor-C element of claim 3, further comprising a Phase Locked Loop coupled to the coarse and fine control circuits for generating control signals for the coarse and fine control circuits.

5. The transconductor-C element of claim 4, wherein the Phase Locked Loop comprises:

a phase detector, coupled to a clock reference signal, for detecting a phase difference between a feedback signal and the clock reference signal, and for generating a phase detector output signal proportional to the phase difference, said phase detector output signal indicating a direction and a magnitude of the phase difference;

a comparator, coupled to the phase detector, for comparing the magnitude and direction of the phase difference between the feedback signal and the clock reference signal generated by the phase detector, and generating a comparator output signal indicative thereof;

a logic circuit, coupled to the comparator, for generating coarse and fine control signals based on the comparator output signal from the comparator;

a bias circuit, coupled to the phase detector, for generating a bias signal based on the phase detector output signal from the phase detector; and a current controlled oscillator coupled to the output of the bias circuit for generating the feedback signal to the phase detector based on the bias signal from the bias circuit.

6. The transconductor-C element of claim 5, wherein the current controlled oscillator comprises:

a first amplifier stage having an input and an output, the first amplifier stage comprising at least one transconductor-C element;

a limiting amplifier stage having an input and an output, the input of the limiting amplifier stage coupled to the output of the first amplifier stage, the limiting amplifier stage comprising at least one transconductor-C element; and a feedback amplification stage having an input and an output, the input of the feedback amplification stage coupled to the outputs of the first amplifier stage and the limiting amplifier stage, the output of the feedback amplification stage coupled to the input of the first amplifier stage, and the feedback amplification stage comprising at least one transconductor-C element.

7. The transconductor-C element of claim 1, wherein the coarse control circuit selectively commences operations in response to a first and a second control signal, wherein current flows through the first amplifier only when the first control signal is present and wherein current flows through the second amplifier only when the second control signal is present.

8. The transconductor-C element of claim 1, wherein the coarse control circuit selectively commences operations in response to a first and a second control signal, wherein current flows through the first amplifier only when the first control signal is not present and wherein current flows through the second amplifier only when the second control signal is present.

9. The transconductor-C element of claim 1, wherein the first and second amplifiers are differential amplifiers, control ports of the differential amplifiers are coupled to the input signal, a first port of the differential amplifiers is coupled to an output of the common mode voltage controller, and a second port of the differential amplifiers is coupled to an input of the coarse control means.

10. The transconductor-C element of claim 1, wherein the first and second amplifiers are single-ended amplifiers, control ports of the amplifiers are coupled to the input signal, a first port of the amplifiers is coupled to an output of the common mode voltage controller, and a second port of the amplifiers is coupled to the coarse control means.

11. The transconductor-C element of claim 1, wherein the first amplifier has a greater current carrying capability than the second amplifier.

12. The transconductor-C element of claim 11, wherein a current channel of the first amplifier is larger than a current channel of the second amplifier, thereby resulting in a greater current carrying capability in the first amplifier.

13. The transconductor-C element of claim 1, wherein the second amplifier has a faster switching time than the first amplifier.

14. The transconductor-C element of claim 13, wherein a current channel of the second amplifier is smaller than a current channel of the first amplifier, thereby resulting in a faster switching time in the second amplifier.

15. An electronic device, comprising:

a first stage with an input and an output, the input of the first stage for receiving an input signal to the electronic device, the first stage comprising at least one transconductor-C element, the output of the first stage being an output of the electronic device;

a parallel stage with an input and an output, the input of the parallel stage coupled to the input signal of the electronic device, the parallel stage comprising at least two transconductor-C elements connected in series; and a feedback amplifier stage with an input and an output, the input of the feedback amplifier stage coupled to the outputs of the first and parallel stages, and the output of the feedback amplifier stage coupled to a junction between the transconductor-C elements connected in series of the parallel stage, the feedback amplifier stage comprising at least one transconductor-C element, wherein the electronic device has fixed poles and an adjustable zero, the poles being fixed by selecting a gain of the parallel stave and the feedback stage, and the zero being adjusted by selecting a gain of the first stage.

16. The electronic device of claim 15, wherein the transconductor-C element further comprises:

a common mode voltage controller for providing a controlled common mode voltage;

a first amplifier, coupled to the common mode voltage controller, for amplifying an input signal with large dynamic range into a higher voltage output signal using the controlled common mode voltage;

a second amplifier, coupled to the common mode voltage controller for amplifying said input signal of rapidly changing frequency into the higher voltage output signal using the controlled common mode voltage;

a coarse control circuit, coupled to the first amplifier and the second amplifier, for selectively commencing operations of the second amplifier and the first amplifier; and a fine control circuit, coupled to the coarse control circuit, for varying a gain in the amplifiers by adjusting the current flow through the selected amplifiers.

17. The electronic device of claim 16, wherein the coarse control circuit is comprised of at least one transistor, a control port of the transistor being coupled to a control signal, a first port of the transistor being coupled to the first amplifier and the second amplifier, and a second port being coupled to the fine control circuit.

18. The electronic device of claim 17, further comprising a Phase Locked Loop for generating the control signals for the coarse and fine control circuits.

19. The electronic device of claim 18, wherein the Phase Locked Loop comprises:

a phase detector, coupled to a clock reference signal, for detecting a phase difference between a feedback signal and the clock reference signal and generating an output signal indicative of the phase difference;

a comparator, coupled to the phase detector, for comparing a magnitude and direction of the phase difference between the feedback signal and the clock reference signal and generating an output indicative of the phase difference;

a logic circuit, coupled to the comparator, for generating control signals based on the output from the comparator;

a bias circuit, coupled to the phase detector, for generating a bias signal based on the output from the phase detector; and a current controlled oscillator coupled to the output of the bias circuit for generating the feedback signal to the phase detector based on the output from the bias circuit.

20. The electronic device of claim 19, wherein the coarse control circuit is turned on and off in response to a control signal, wherein current selectively flows through the first amplifier and the second amplifier when the coarse control circuit is turned on and current does not selectively flow through the first amplifier and the second amplifier when the coarse control circuit is turned off.

21. A method for controlling an amplification output of an amplification stage, comprising the steps of:

providing a controlled common mode voltage to a plurality of parallel amplifier stages, at least one amplifier stage comprising an amplifier with high current capability, and at least another amplifier stage comprising another amplifier with high speed capability;

selecting one or more of the amplifiers using coarse control signals by allowing current to flow through the selected amplifiers; and varying a gain of the selected amplifiers using a fine control signal to control the amplification output of the amplification stage.

* * * * *

UNITED STATES PATENT AND TRADEMARK OFFICE
CERTIFICATE OF CORRECTION

PATENT NO. : 5,701,099

DATED : DECEMBER 23, 1997

INVENTOR(S) : SHAFIR

It is certified that error appears in the above-identified patent and that said Letters Patent is hereby corrected as shown below:

In column 4, line 42, "Again," starts a new paragraph.

In column 5, line 50, "on" should read —in—.

In column 7, line 15, "gm3Vbp-gmSVin" should read —gm3Vbp-gm5Vin—.

In column 8, line 13, "gm3Vbp-gmSVin" should read —gm3Vbp-gm5Vin—.

In column 7, line 47, insert —Zero:— after the word "by:".

In column 7, line 66, "I2=-gin2Vbs" should read —I2=-gm2Vbs—.

In column 7, line 67, "I3=gin3Vbp" should read —I3=gm3Vbp—.

In column 8, line 9, "I3+I5=SC2V1p" should read —I3+I5=sC2V1p—.

In column 8, line 12, "gm3Vbp-gmSVin" should read —gm3Vbp-gm5Vin—.

Signed and Sealed this

Twelfth Day of January, 1999

*Attest:*

*Attesting Officer*   *Acting Commissioner of Patents and Trademarks*